United States Patent [19]

Chaki et al.

[11] Patent Number: 4,468,976
[45] Date of Patent: Sep. 4, 1984

[54] PUSHBUTTON-OPERATED WAVEBAND OR STATION SELECTOR

[75] Inventors: Takao Chaki; Nobuaki Watanabe, both of Tokyo, Japan

[73] Assignee: Clarion Co., Ltd., Tokyo, Japan

[21] Appl. No.: 340,942

[22] Filed: Jan. 20, 1982

[30] Foreign Application Priority Data

| Jan. 22, 1981 | [JP] | Japan | 56-6545 |
| Jan. 23, 1981 | [JP] | Japan | 56-7283 |
| Jan. 29, 1981 | [JP] | Japan | 56-10239 |
| Feb. 13, 1981 | [JP] | Japan | 56-18142 |
| Feb. 13, 1981 | [JP] | Japan | 56-18143 |
| Feb. 13, 1981 | [JP] | Japan | 56-18144 |
| Mar. 31, 1981 | [JP] | Japan | 56-47852 |

[51] Int. Cl.³ .......................... H03J 5/12; H03J 1/08; F16D 13/44
[52] U.S. Cl. .................... 74/10.33; 74/10.8; 192/89 A; 334/7
[58] Field of Search ............ 192/89 A; 74/10.33, 74/10.37, 10.8; 334/7

[56] References Cited

U.S. PATENT DOCUMENTS

| 3,947,786 | 3/1976 | Gordon | 334/7 |
| 3,995,242 | 11/1976 | Chaki | 334/7 |
| 4,079,631 | 3/1978 | Chaki | 334/7 X |
| 4,262,547 | 4/1981 | Kanai et al. | 334/7 X |
| 4,348,911 | 9/1982 | Tanaka et al. | 334/7 X |

Primary Examiner—Allan D. Herrmann
Attorney, Agent, or Firm—Flynn, Thiel, Boutell & Tanis

[57] ABSTRACT

A pushbutton-operated waveband or station selector or tuner, comprising a front panel to which a bracket for each pushbutton is supported perpendicular thereto so as to be movable to-and-fro, said pushbutton being provided with a push piece for kick arm and a setting plate which can engage a pivoting crank, the kick arm being disposed on the rear side of said front panel parallelly thereto, so that it is pivotable with respect to right and left side plates of the apparatus. At the rear of said kick arm, there is disposed the pivoting crank (31) which is mounted at the opposite ends thereof so as to be pivotable with respect to the frame side plate, and above said pivoting crank there is movably supported a core slide which is coupled with said pivoting crank, said core slide having mounted on the rear portion thereof a plurality of cores directed toward the rear side of the apparatus, these cores each being inserted into a movable to-and-fro in a respective tuning coil disposed at the rear of the apparatus. A tuning shaft is supported above the pushbutton on the front panel, a clutch mechanism is disposed at the rear of the apparatus, a pinion interlocked with the tuning shaft is in mesh with a crown gear of said clutch mechanism, while a gear provided on said pivoting crane is in mesh with the clutch gear of the clutch mechanism, and a clutch lever of this clutch mechanism is engaged with said kick arm.

10 Claims, 21 Drawing Figures

4,468,976

PUSHBUTTON-OPERATED WAVEBAND OR STATION SELECTOR

BACKGROUND OF THE INVENTION

1. Field of the Invention

The present invention relates to a pushbutton-operated waveband or station selector, and more particularly to an improved arrangement of the clutch mechanism and manual-operating tuning shafts thereof.

2. Description of the Prior Art

The pushbutton-operated waveband or station selector is a device in which a crank is provided through a predetermined angle by means of one of plural station selecting pushbuttons to insert or extract a tuning core into or from a tuning coil for the purpose of selecting a desired station. Further, the waveband or station selector is provided with a manual tuning knob in addition to the above-mentioned waveband or station selecting pushbuttons. By turning the tuning knob, it is possible to select other stations than selected by means of the pushbutton, to make a fine adjustment at time of the waveband or station selection, or to set a carrier frequency for each of the pushbuttons. If the pivoting crank is left as coupled with the tuning knob during the operation of the pushbuttons, the load will be too large to smoothly operate the pushbuttons; to avoid this, there is provided a clutch mechanism between the crank and the tuning knob. This clutch is so designed that it is disconnected when any one of the pushbuttons is operated and that only the crank is pivoted without turning the tuning knob, thus reducing the load to the pushbuttons.

The conventional clutch mechanism and tuning knob interlocked with such clutch mechanism are so arranged that they protrude out of the frame side panel of the pushbutton-operated waveband or station selector. Specifically, a plurality of pushbuttons is disposed on the frontal side of the selector while the cllutch mechanism and tuning knob are arranged on the lateral side thereof. However, as the pushbutton-operated waveband or station selector has recently been designed compact, it has been proposed to reduce the the width of the apparatus as a whole. In this case, since it is impossible to make the width of the selector body smaller than a certain extent because of the number of tuning coils or of the width of the operating pushbuttons, the clutch mechanism and tuning knob which are disposed outside the selector frame must be reduced as much as possible. However, the conventional pushbutton-operated waveband or station selectors are designed under the assumption that the clutch mechanism and manual tuning knob are located outside the selector frame; therefore, however compact the components of the selector are designed, the clutch mechanism and tuning knob are so arranged as to protrude out of the frame. The reduction of the width of the selector as a whole is thus limited.

SUMMARY OF THE INVENTION

Accordingly, the present invention has as an object to overcome the above-mentioned drawbacks of the conventional apparatus, and provides a pushbutton-operated waveband or station selector of which the clutch mechanism and the tuning knob interlocked therewith are disposed above the pushbuttons and pivoting crank, namely, all the mechanisms are disposed within the apparatus frame, the width of which as a whole is very small.

The foregoing and other objects of the present invention can be attained by providing a pushbutton-operated waveband or station selector which will be disclosed herein.

The present invention will be better understood from the ensuing explanation made by way of example of the embodiments of the present invention in reference to the accompanying drawings.

BRIEF DESCRIPTION OF THE DRAWINGS

FIGS. 9(A) and 9(B) are fragmentary top views showing a variation of the clutch disconnecting mechanism according to the present invention, FIG. 9(A) showing a clutch lever in a connected position while FIG. 9(B) shows the clutch lever in a disconnected position;

FIGS. 12 thru 14 are exploded perspective views, respectively, of three variations of a switch according to the present invention;

FIG. 16 is a fragmentary plan view showing a variation of a core stroke adjusting mechanism of the pushbutton-operated waveband or station selector according to FIG. 1.

DETAILED DESCRIPTION OF THE PREFERRED EMBODIMENTS

Figure 1:
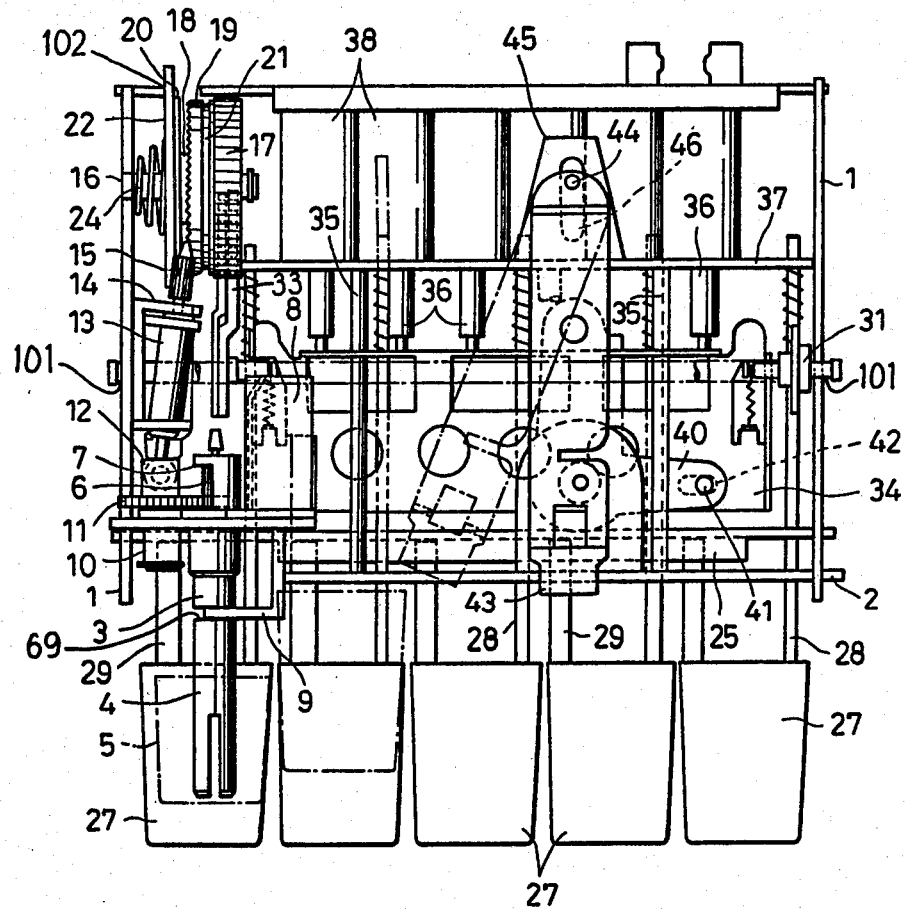
FIG. 1 is a plan view showing one embodiment of the pushbutton-operated waveband or station selector according to the present invention.
Figure 2:
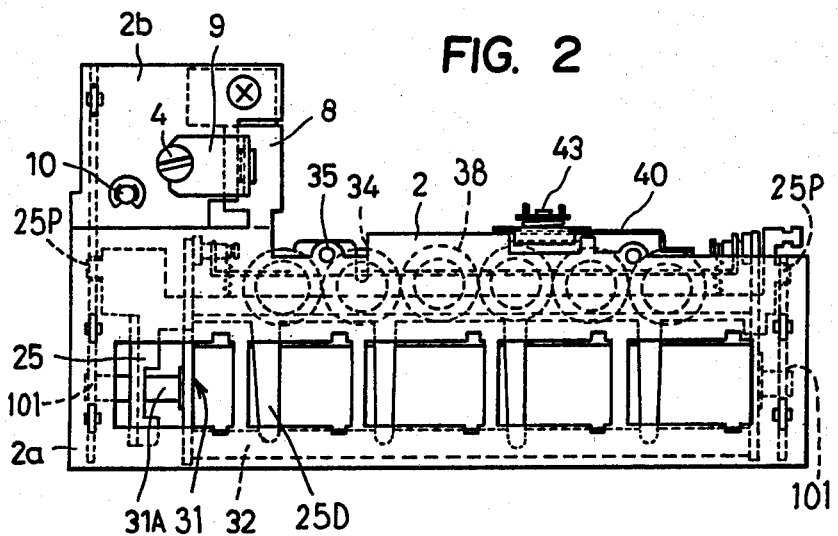
FIG. 2 is a front view of the selector in FIG. 1.
Figure 3:
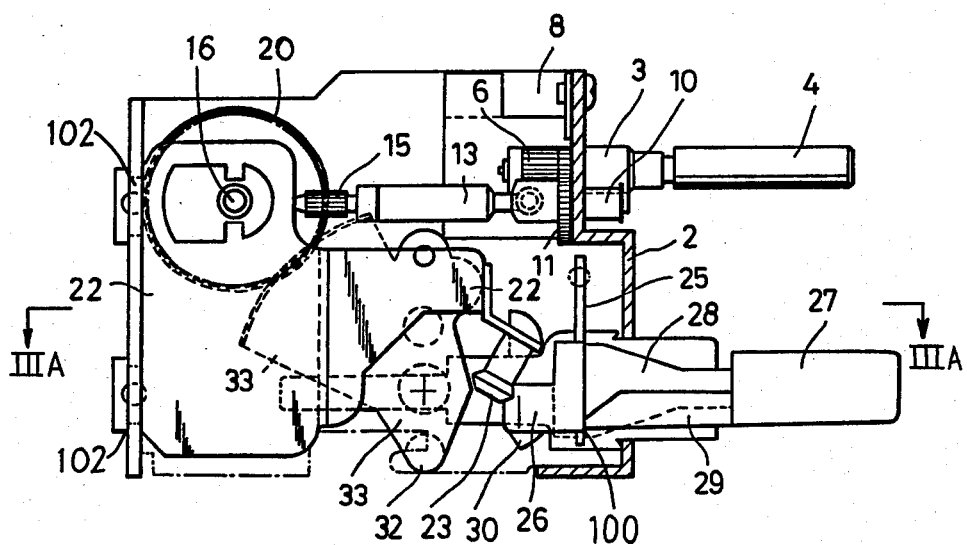
FIG. 3 is a sectional view of the selector in FIG. 1.
Figure 3A:
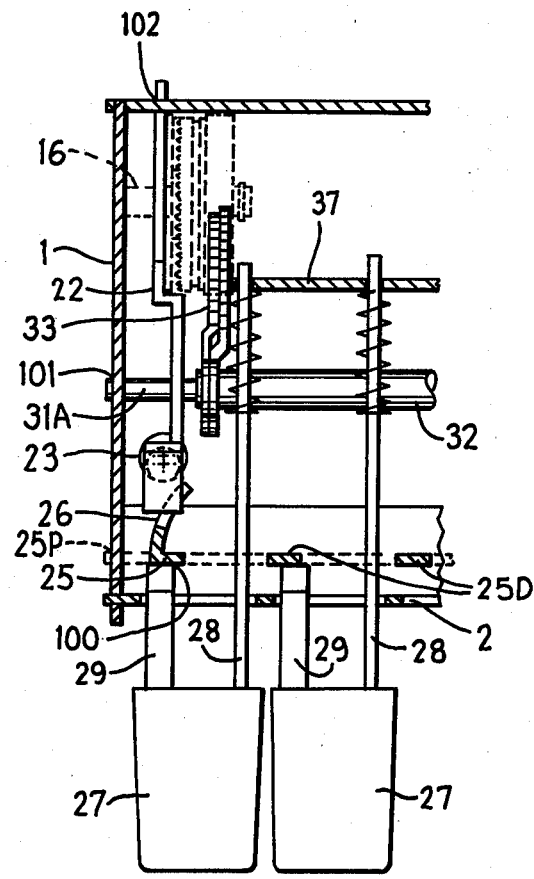
FIG. 3A is a sectional view taken along the line IIIA—IIIA in FIG. 3.

In FIGS. 1 thru 5, the reference numeral 1 denotes right and left side plates of the pushbutton-operated waveband or station selector according to the present invention, and the numeral 2 indicates a front panel. This front panel 2 consists of a right-left extending rectangular-shaped pushbutton fitting portion 2a, and a tuning shaft fitting portion 2b which extends in an L-shape above the pushbutton fitting portion 2a. Of the right and left side plates, the one on the side of the tuning shaft fitting portion 2b has the same height as from the bottom of the pushbutton fitting portion 2a up to the top edge of the tuning shaft fitting portion 2b.

The tuning shaft fitting portion 2b has fixed thereto a bearing 3 in which a tuning shaft 4 is supported rotatably and axially slidably. The front end of the tuning shaft 4 is protruded out on the front side of the front panel 2, and a tuning knob 5 is provided on the protruded end of the tuning shaft 4. A sliding gear 6 is formed integrally with the tuning shaft 4 at the opposite end thereof, and is accessible through a slot or cut 7 formed in the bearing 3 of the tuning shaft 4.

On the back of the tuning shaft fitting portion 2b, there is fixed a power switch 8 in the proximity of the bearing 3 of the tuning shaft 4. The control lever 9 for the power switch 8 extends to the front of the front panel 2 and has a free end which is bent like a key and engages a circumferential groove 6a in the tuning shaft 4.

Further, there is provided in the tuning shaft fitting portion 2b a bearing 10 which is parallel with the bearing 3 of the tuning shaft 4. An idler gear 11 is rotatably supported within the bearing 10. This idler gear 11 is in mesh with the sliding gear 6 through the cut 7 in the bearing 3. The idler gear 11 has provided on the back thereof a universal joint 12 to which the base end of a pinion gear shaft 13 is secured. This pinion gear shaft 13 is rotatably supported by a fork bracket 14 fixed inside the side plate 1. The pinion gear shaft 13 has portions of smaller diameter which are rotatably received in openings in the fork bracket to vertically position the pinion gear shaft 13. The pinion gear shaft 13 has provided at the opposite end thereof a pinion 15 which is in mesh with a crown gear 19 of a clutch mechanism which will be described below.

The clutch mechanism is disposed between the frame side plates and is located above the pushbutton brackets assembled inside the frame. Namely, there is fixed at the rear upper portion of the left frame side plate 1 a clutch shaft 16 extending inwardly of the side plate 1. The clutch shaft 16 has a clutch gear 17 supported rotatably on the inner end thereof. A sleeve 18 is rotatably and slidably supported on the clutch shaft 16 between the side plate 1 and the clutch gear 17. This sleeve 18 has installed thereon a crown gear 19 and a disk-like spring 20. The crown gear 19 is provided on the side of the clutch gear 17 on which is provided a frictional-engaging member 21 such as synthetic rubber, emery paper or other. The crown gear 19 is in mesh with the pinion 15 provided on the end of the pinion gear shaft 13. Engaged at its end by the disk-shaped spring 20 (FIG. 5), the pinion 15 is forced to the crown gear 19 so that no backlash will occur between the pinion 15 and the crown gear 19.

A clutch lever 22 engages an end of the sleeve 18 on the clutch shaft 16; it is mounted movably with respect to the rear frame of the pushbutton-operated waveband or station selector. The clutch lever 22 can be oscillated to the right and left about the portion 102 at which it is mounted. Further, the clutch lever 22 has an end (on the front side) which is extended nearly to the rear face of the front panel 2 so that it is located just below the universal joint 12. There is provided on the front end of this clutch lever 22 a roller 23 which can engage a kick lever which will be described later. In addition, a coil spring 24 is provided and is compressed between the clutch lever 22 and frame side plate 1. That is, the clutch lever 22 is biased by the coil spring 24 toward the clutch gear 17, and thus the crown gear 19 which engages with the clutch lever 22 is also biased toward the clutch gear 17.

There is disposed on the rear face of said front panel 2 a kick arm 25 parallel therewith. The kick arm 25 is pivotably supported at both ends thereof (at 25P) on the right and left side plates 1. A push piece 26 is integrally formed on the end of the kick arm 25 on the side of the tuning knob. The push piece 26 can engage the engagement roller 23 provided on the front end of the above-mentioned clutch lever 22.

Further, a bracket 28 for each pushbutton 27 is reciprocally movably supported on the front panel 2 perpendicular thereto. Each pushbutton 27 has provided thereon a push piece 29 which extends parallel to its bracket 28, and the push piece 29 is in contact at the front end thereof (at 100 in FIG. 3) with a respective depending arm 25D of the above-mentioned kick arm 25. That is, when the pushbutton 27 is depressed, the push piece 29 causes the kick arm 25 to pivot about its flucrum inwardly of the pushbutton-operated waveband or station selector. Further, nearly at the center of the bracket 28 of each pusbutton there is provided a sector-shaped setting plate 30 (FIG. 4) in such a manner that its angle of fitting can be adjusted. The setting plate 30 is so disposed that movement of the bracket 28 causes it to engage two crank rods 32 of a pivoting crank 31 provided to the rear of the kick arm 25 and parallel therewith. Also the pivoting crank 31 is pivotably supported at the both ends thereof on the side plates 1 of the pushbutton-operated waveband or station selector frame (at 101 in FIG. 1). The pivoting crank 31 includes right and left side plates and two crank rods 32 which couple the side plates to each other. There is formed on the side panel of the clutch gear 17 located at the side end of the pivoting crank 31 a crank gear 33 (FIG. 3) which is in mesh with the clutch gear 17 of the clutch mechanism. It should be noted that a double gear which is biased by a spring is used as this crank gear 33 in order to prevent any backlash with the clutch gear 17.

Figure 4:
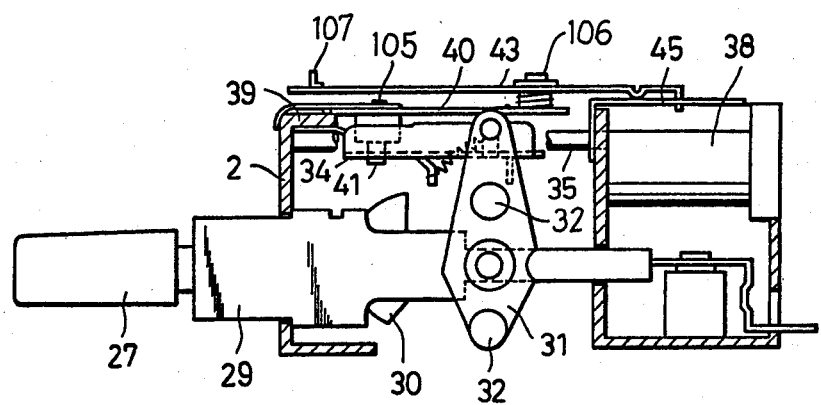
FIG. 4 is a sectional side view of a selector similar to that in FIG. 1 but having a different kick arm.
Figure 5:
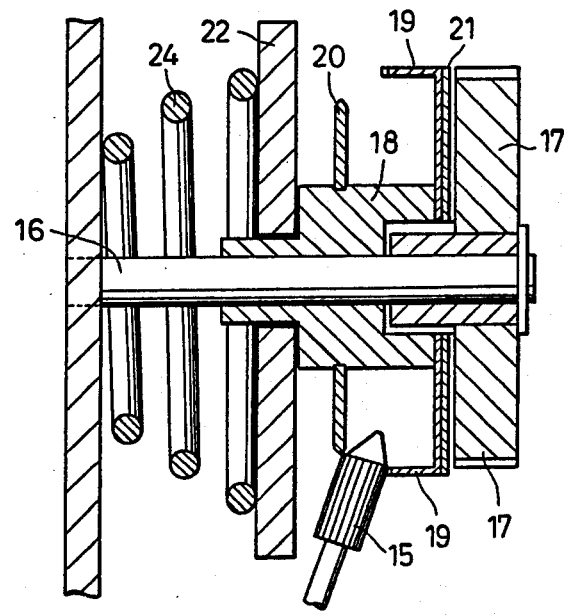
FIG. 5 is a sectional view, in a larger scale, of the clutch mechanism of the selector in FIG. 1.

There is disposed above the pivoting crank 31 a core slide 34 movable in the forward and rearward directions of the pushbutton-operated waverange or station selector. This core slide 34 is supported slidably, for example on a guide shaft 35 extending in the front to rear direction of the selector, and the top end of the side panels of the above-mentioned pivoting crank 31 are pivotally coupled with this core slide 34 (FIG. 4). The core slide 34 has fixed on the rear face thereof a plurality of cores 36 directed rearward of the pushbutton-operated waveband or station selector. This plurality of cores 36 extend toward a coil mount plate 37 disposed on the rear portion of the selector frame and parallel with the front panel and the cores 36 are axially movably inserted into coils 38 secured on the rear face of the coil mount plate 37.

There is further provided above the core slides 34 an indicator mechanism of the apparatus. More particularly, a support plate 39 extends horizontally from the upper edge of the front panel 2 toward the rear of the apparatus, and a moving plate 40 is supported on this support plate 39 so as to be pivoted about its support shaft 105. This moving plate 40 has two arms extending generally perpendicularly to each other, one of which has provided on the free end thereof a pin 41 directed downward. This pin 41 is inserted in a slot 42 formed in the core slide 34 perpendicular to the moving direction thereof. The other arm of the moving plate 40 has provided rotatably on the free end thereof an indicating plate 43 by means of a support shaft 106. The free end of this indicating plate 43 extends to a location above the front panel of the apparatus. A pointer 107 is fixed to the free end of this indicating plate. On the contrary, the rear end of the indicating plate 43 is extended to the rear of the apparatus and has integrally formed thereon a projection 44 directed downward. This projection 44 is slidably received in a slot 46 in a guide plate 45 provided on the upper edge of the above-mentioned coil mount panel 37.

Constructed as having been described in the foregoing, the pushbutton-operated waveband or station selector according to the present invention operates as described below.

To turn on and off the power switch of the apparatus, the tuning knob 5 fixed to the front end of the tuning shaft 4 is pushed in toward the frame. Then, the tuning shaft 4 goes into to the frame since it is supported axially movably within the bearing 3, thereby pushing in the operating rod 9 engaging with the tuning shaft 4 so that the power switch 8 is turned on. In this case, the slide gear 6 provided on the front end of the tuning shaft 4 is moved rearward of the apparatus while being in mesh with the idler gear 11. When the power switch 8 is turned on toggled, the tuning shaft 4 is returned to the front position.

Operating the apparatus thus energized, a waveband or station is selected as follows.

For manual tuning, the tuning knob 5 is used to turn the tuning shaft 4. As this shaft 4 is turned, the pinion gear shaft 13 coupled with the idler gear 11 by means of the universal joint 12 is rotated since the slide gear 6 at the front end of the tuning shaft 4 is in mesh with the idler gear 11; also the crown gear 19 in mesh with the pinion at the front end of the pinion gear shaft is rotated. In this condition, the sleeve 18 having the crown gear 19 fitted thereon is urged toward the clutch gear 17 under the action of the coil spring 24, thus the crown gear 19 and clutch gear 17 are rotationally coupled with each other by means of the frictional engagement member 21. Therefore, as the crown gear 19 is rotated due to the rotation of the tuning shaft, the clutch gear 17 is also rotated. When the clutch gear 17 is rotated, the crank gear 33 in mesh therewith is also rotated so that the pivoting crank 31 connected to the crank gear is pivoted. As the pivoting crank moves in this way, the core slide 34 coupled to the pivoting crank 31 moves forwardly or rearwardly along the guide shaft 35 within the frame of each apparatus; thus, the core 36 fixed to the core slide 34 is moved with variation of the inserted position into the associated coil 38. As the result, the inductance of the coil 38 changes, namely, tuning or selection of a desired waveband or station is attained.

In this case, the indicator mechanism to indicate the tuned frequency will function as follows.

When the core slide 34 moves to-and-fro due to the pivoting of the pivoting crank 31, one of the arms of the moving plate 40 engaged in the slot 42 is pushed so that the moving plate 40 is rotated about its support shaft 105. Then, the pointer plate 43 coupled with the other arm of the moving plate 40 is deflected right-left about its rear end 44. As the result, the front end of the pointer plate 43 changes right-left and stops at a position corresponding to the inserted position of the core in the coil 38. In this case, since the projection 44 provided on the rear end of the pointer plate 43 slides along the slot 46 in the guide plate 45, the front end of the pointer plate 43 delineates a relatively rectilinear orbit along the front panel 2.

For tuning by the pushbutton operation, one of the pushbuttons 27 is to be selected and pressed. When the pushbutton is depressed, the sector-shaped setting plate 30 provided on the bracket 28 of that pushbutton causes the pivoting crank 31 to pivot through a predetermined angle corresponding to the angular position of the plate 30. With this motion of the pivoting crank 31, the core slide 34 coupled to this crank is moved so that the inserted position in the coil 38 of the core fixed on the core slide is changed, and thus tuning is effected. However, in this tuning by the pushbuttons 27, it is necessary to disconnect the clutch during the pressing operation of the pushbutton. That is, the push piece 29 provided on the pushbutton moves rearward so that the kick arm 25 in contact with the front end of the push piece 29 pivots about its fulcrum 25P toward the rear of the apparatus. Then, the push piece 26 provided on the kick arm 25 pushes the front end of the clutch lever 22 toward the left side panel 1 of the apparatus frame (laterally). In this case, since the push piece 26 and clutch lever 22 are in contact with each other by means of the engagement roller 23, both slide smoothly. When the clutch lever 22 is pressed toward the side panel 1 of the apparatus frame, the pressure of the coil spring 24 applied through the clutch lever 22 is eliminated so that the forced engagement between the crown gear 19 and clutch gear 17 is also eliminated. As the result, the clutch gear 17 will be freely rotatable without restriction by the motions of the crown gear and the pinion gear shaft and tuning shaft engaged with the crown gear. Accordingly, when the pushbutton 27 is pressed to pivot the pivoting crank 31, this crank 31 will rotate very smoothly since it causes only the clutch gear 17 to rotate.

As having been described in the foregoing, the embodiment of the pushbutton-operated waveband or station selector has the tuning shaft and clutch mechanism interlocked with the shaft, both of which are disposed inside the side plate 1 of the apparatus frame; this embodiment is advantageous in that the width of this apparatus is reduced to that nearly equal to the width of the space in which the pushbuttons are arranged.

Figure 6:
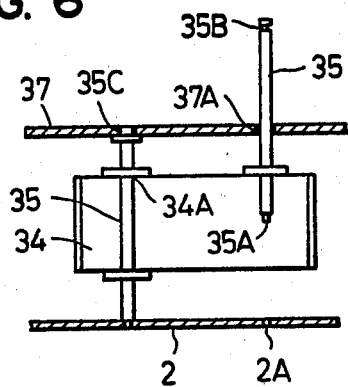
FIG. 6 is a fragmentary sectional top view showing the support of a guide shaft according to the selector of FIG. 1.

FIGS. 6 thru 8 show variations of the embodiment described in the foregoing. These variations have the following object: Namely, the guide shaft is so mounted between the coil mount plate and front panel that it is rotatable but stationary in the axial direction; this provides that if the guide shaft is mounted with a lower precision than desired, for example, when the core slide moves to-and-fro, the guide shaft moves in the rotating direction so that both of them can slide smoothly.

Referring now to FIG. 6, there are formed in the portions of the front panel where the guide shaft 35 are to be installed holes 2A in which the guide shafts rest.

On the other hand, there are provided in the portions of the coil mount plate 37 where the guide shaft 35 is to be installed, holes 37A in which the guide shaft 35 is inserted, these holes having an inside diameter greater than the outside diameter of the guide shaft 35.

In the end of the guide shaft 35 on the side of the front panel 2, there is formed a fitting portion 35A of which the diameter is small as compared with the guide shaft 35. This fitting portion 35A is fitted in the engagement hole 2A in the front panel 2. Further, there is formed a recess or circumferential groove 35B in the end of the guide shaft 35 on the side of the coil mount plate 37 and in the position nearer the front panel than the end face of the coil mount plate 37 by the thickness of the latter. The recess is positioned along the circumference of the guide shaft. The guide shaft 35 thus composed is inserted through the insertion hole 37A in the coil mount plate 37 in the guide hole 34A in the core slide 34, and further the fitting portion 35A of the guide shaft 35 is fitted into the engagement hole 2A in the front panel 2. The other end of the guide shaft 35 is supported in the insertion hole 37A in the coil mount plate 37. The recess 35B in the guide shaft 35 is positioned on the side of the coil mount plate 37 facing the front panel 2. An engagement piece 35C such as an E ring is fitted in the recess 35R. The engagement piece 35R fitted in the recess 35B engages the front face of the coil mount plate 37 to prevent the guide shaft 35 from moving in the extracting direction. Of course, the movement of the guide shaft 35 in the inserting direction (frontward) is prevented because the fitting portion 35A at the front end of the guide shaft is fitted in the engagement hole 2A in the front panel 2.

According to this variation, the guide shaft 35 is limited against axial movement, but it is freely movable in the rotating direction. Consequently, even if the guide shaft is mounted eccentrically or at an angle somewhat different from the specified value, or even if the guide shaft is curved, there is a play between the guide shaft, front panel and coil mount plate. Therefore, even if the core slide is forcibly engaged with the guide shaft as the core slide moves, the guide shaft rotates, thus providing clearance so that the core slide and guide shaft can slide smoothly. Further, in case the guide shaft is extracted for the purpose of replacing the core slide or the core mounted thereon, the guide shaft can be easily removed only by detaching the E ring. Thus, the core slide or core can be easily replaced.

Figure 7A:
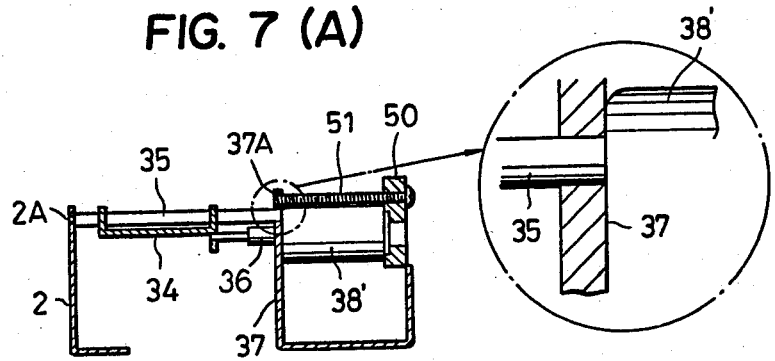
FIGS. 7(A) and 7(B) are sectional side views, respectively, of a variation of the guide shaft mounting arrangement of FIG. 6.
Figure 7B:
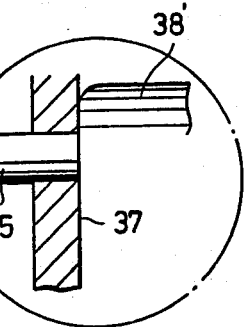

In the variation shown in FIGS. 7(A) and 7(B), the front end of the guide shaft is fitted to the front panel 2 similar to the variation shown in FIG. 6. On the other hand, the base portion of the guide shaft 35 is fixed using no E ring. Namely, the insertion hole 37A is formed in the coil mount plate 37 for insertion of the guide shaft 35. With the guide shaft 35 inserted in this insertion hole 37A, the coil case 38' is fixed on the rear side of the coil mount plate. By locating the front end of the coil case 38' so as to block the insertion hole 37A in the coil mount plate 37, the guide shaft 35 is prevented from being extracted from the insertion hole 37A. In this case, the coil case 38' is supported between the coil mount plate 37 and a terminal board 50. This terminal board 50 and the coil mount plate 37 are secured by tightening a screw 51.

Also in this variation, the guide shaft 35 is limited against axial movement but is freely rotatable. Accordingly, there occurs clearance between the core slide and guide shaft, thus the core slide is permitted to slide smoothly. Further in this variation, in order to remove the core slide, it is detached from the coil mount plate by removing the screw 51 from the terminal board 50, and then the coil case is removed to pull the guide shaft 35 out of the insertion hole 37A in the coil mount plate 37.

Figure 8A:
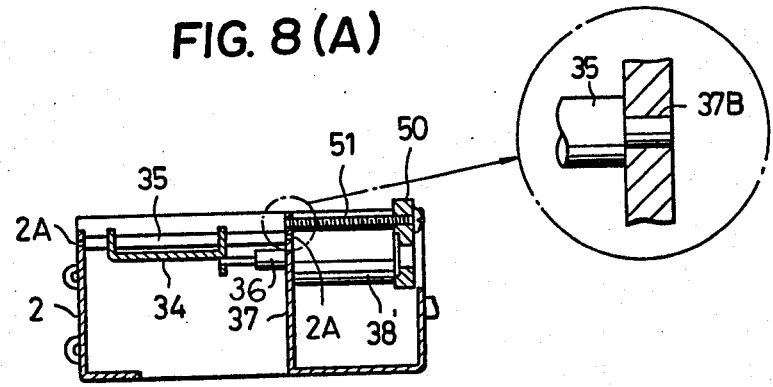
FIGS. 8(A) and 8(B) are sectional side views, respectively, of a further variation of the guide shaft mounting arrangement of FIG. 6.
Figure 8B:
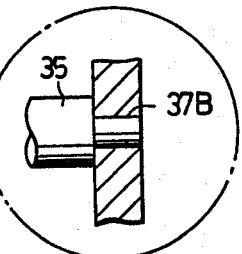

In the variation shown in FIGS. 8(A) and 8(B), there are formed fitting portions 35A and 35B of small diameter at the opposite ends of the guide shaft 35. Besides, engagement holes 2A and 37B are formed in the front panel 2 and coil mount plate 37, respectively, for receiving the fitting portions 35A and 35B. In this variation, to fix the guide shaft 35 between the front panel 2 and coil mount plate 37, the core slide 34 is previously mounted on the guide shaft 35. Then, the guide shaft 35 is sandwiched between the front panel 2 and coil mount plate 37, and the fitting portions 35A and 35B are fitted into the engagement holes 2A and 37B, respectively, in the front panel 2 and coil mount plate 37. After the guide shaft 35 is supported between the front panel 2 and coil mount plate 37 in this way, the front panel 2 and coil mount plate 37 are fixed by means of the side panels of the apparatus so that the distance between them will not be increased. Thus, the guide shaft 35 is not axially slidable but is freely rotatable, between the front panel 2 and coil mount plate 37.

In the variation shown in FIGS. 8(A) and 8(B), since the clearance between the core slide and guide shaft is assured when the core slide is moved, the core slide is smoothly slidable.

In the variation shown in FIG. 6, for example, the insertion hole is formed in the coil mount plate while the engagement hole is provided in the front panel. However, it should be noted that these holes may be formed in the front panel and coil mount plate, respectively, or in other words reversed so that the guide shaft may be inserted from the front panel side. Various other constructions are possible.

Figure 9:
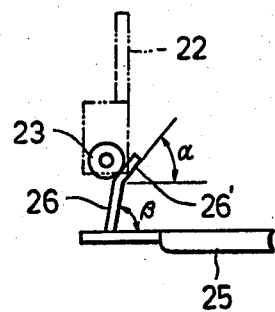
Figure 9:
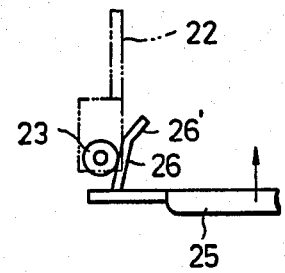

FIGS. 9(A) and 9(B) show a variation of the pushbutton-operated waveband or station selector having been described in the foregoing, in which the push piece is provided oblique with respect to the kick arm so that the engagement between the push piece and the roller when the clutch is disconnected can be eliminated and so that when the pushbutton returned to the initial state, the clutch can be positively connected.

As shown in FIG. 9(A), there is provided at the end of the kick arm 25 a push piece 26 projecting toward the roller 23. This push piece 26 is projecting oblique with respect to the kick arm 25. There is provided on the front end of the push piece 26 a tapered portion 26' in a position where it will get into contact with the roller 23 during disencasement of the clutch. The inclination of this tapered portion 26' takes a smaller angle with respect to the kick arm 25 than the inclination β of the push piece 26 as shown in FIG. 9(A).

In this variation of the clutch mechanism according to the present invention, the pushpiece 26 provided on the kick arm is formed so as to be oblique with respect to the surface of the kick arm. Thus, when the kick arm 25 is pressed as shown in FIG. 9(B), the roller 23 on the clutch lever engages the surface of the inclined push piece 26. By releasing the pushbutton in this state, the roller 23 on the clutch lever will move along the inclined surface of the push piece 26 to the tapered portion 26'. In this case, as the roller is applied with a pressure by the spring 24 biasing the clutch lever 22, it will move rotating smoothly. As the result, the kick arm 25 is pressed by the roller and pivots to the front side, thus returning to the vertical position after the pushbutton is released. Of course, a return spring is provided for this kick arm 25. The kick arm 25 will return smoothly to the vertical position under the pressure of the spring and roller 23. Also in this variation, the angle of the push piece is different from that of the tapered portion at the front end thereof so that there is a step between their boundary surfaces. By making such an arrangement the clutch is positively disconnected when the roller rides over the above-mentioned step, and it is possible to definitely confirm when the clutch is completely disconnected. Further, since the push piece 26 and the tapered portion 26' at the front end thereof are inclined, the roller can smoothly move along the inclination. As the result, another advantage is obtained that only a small force is required for operation of the pushbuttons as compared with the conventional apparatus.

Figure 10:
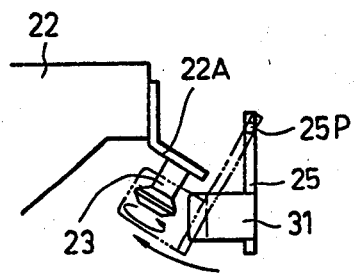
FIG. 10 is a side elevation showing the disposition of a kick arm and a roller on the clutch lever.

FIG. 10 shows a variation of the clutch lever for use in the pushbutton-operated waveband or station selector according to the present invention, in which the roller on the front end of the clutch lever is so mounted that it will rotate in the same direction as the direction of pivotal movement of the push piece piece of the kick arm, so that the pressure of the kick arm will act only for lateral movement of the clutch lever.

As seen in FIG. 10, the clutch lever 22 has formed integrally therewith on the front end thereof a bent roller mount plate 22A of which the front end is inclined. There is mounted a roller 23 on the lower side of the inclined portion. The angle at which the roller 23 is mounted, is so selected that the roller will rotate in the same direction as the kick arm 25 moves. Namely, the kick arm 25 pivots about the fulcrum 25P which engages the side panel of the apparatus frame, so that the push piece 26 delineates a circular orbit. The roller 23 is disposed at a point on the circular orbit and the push piece 76 moves in a direction corresponding to the direction of a tangent of the circular roller 23.

As described in the above, the clutch lever is so constructed that the roller mounted on the front end thereof rotates in the same direction as the kick arm moves. Thus, the pressure of the kick arm will act as a force to make the roller rotate, namely, a force to move the clutch lever laterally. As the result, the resistance against the rotation of the roller is eliminated, and also the reaction of the clutch lever to the kick arm is nulled, so that the force necessary for operation of the pushbuttons to pivot the kick arm is advantageously reduced. Further, since the pressure of the kick arm acts as a force to make the clutch lever move laterally, the clutch lever can be moved smoothly and positively, thus providing a more stable disconnection of the clutch by the clutch lever.

Figure 11:
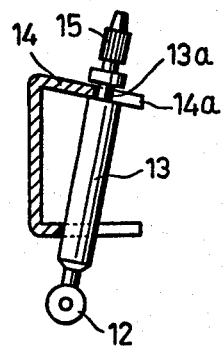
FIG. 11 is a plan view showing a variation of a bearing mechanism of the selector in FIG. 1.

FIG. 11 shows a variation of the pinion gear shaft bearing mechanism according to the present invention, in which a bearing plate supporting the pinion gear shaft, more particularly, the bearing plate on the side of the clutch mechanism, is disposed perpendicular to the pinion gear shaft so as to minimize the width of the recess formed in the pinion gear shaft and to prevent wobble thereof.

As shown in FIG. 11, the bearing plate 14 (fork bracket) nearest the clutch mechanism is disposed obliquely with respect to the bearing plate 14 on the front side. That is, the bearing plate 14 on the side of the clutch mechanism is perpendicular to the pinion gear shaft 13 supported thereby. The pinion gear shaft 13 is rotatably fitted in the U-shaped cut 14a in the bearing plate 14, and a groove or recess 13a is formed in the portion of the pinion gear shaft 13 at which the shaft engages in the cut 14a. This recess 13a has a width somewhat greater than the thickness of the bearing plate 14. The U-shaped cut 14a formed in the bearing plate 14 is slidably fitted at the opening edge thereof on the recess 13a.

As described in the above, the bearing mechanism according to the present invention comprises a pinion gear shaft bearing plate disposed perpendicular to the pinion gear shaft. Therefore, the width of the recess formed in the pinion gear shaft can be considerably reduced as compared with the conventional mechanism in which the bearing plate and pinion gear shaft are mounted oblique with respect to each other. As the result, the clearance between the recess and the bearing plate is small, with little axial movement of the pinion gear shaft. Further, the pinion gear shaft may not oscillate right-left about the universal-joint portion of the base end of the pinion gear shaft. Thus, the pinion gear shaft rotates smoothly, and the backlash between the crown gear and pinion is eliminated. This results in accurate transmission of the turning force from the tuning knob to the clutch mechanism, thus eliminating the deviation of frequency so that the functional improvement of the pushbutton-operated waveband or station selector can be attained.

FIGS. 12 to 14 show variations of the pushbutton switch support arrangement for use in the pushbutton-operated waveband or station selector according to the present invention, in which an engagement piece on the pushbutton switch as the previously-mentioned power switch is engaged in a cut in a tongue piece provided on the front panel, thereby permitting the mounting of the pushbutton switch to the front panel with only one screw.

As shown in FIGS. 12 and 13, the tuning shaft 4 is movably supported in the front panel 2 of the apparatus, and a fixing hole 60 is provided in the front panel 2 in the obliquely upper position to mount the pushbutton switch 8. There is provided a positioning concavity (or hole) 61 by the side of the fixing hole 60 also in the front panel 2. Further, below the fixing hole 60 in the front panel 2, there is provided a tongue piece 62 perpendicular to the rear side of the front panel 2, and a cut 63 is formed in the tongue piece 62; this cut may be a recess of which the one end is opened as shown in FIG. 12, or a slit as shown in FIG. 13. On the other hand, there is formed an internally-threaded screw hole 65 in the front plate 64 of the pushbutton switch 8. By the side of the screw hole 65 there is formed a positioning projection 66. There is provided an engagement piece 67 projecting downward from the lower edge of the front plate 64.

Further, the operating lever 9 projects outwardly from the center of the switch for turning on and off the switch. The lever has formed in the front end thereof a cut 68 which engages in the groove 69 engraved in the tuning shaft 4.

According to first and second variations of the pushbutton switch fixing mechanism of the present invention, the pushbutton switch 8 is mounted to the front panel 2 by firstly inserting the engagement piece 67 of the pushbutton switch 8 into the cut 63 in the tongue piece 62 of the front panel 2.

Secondly, the cut 68 formed in the front end of the operating lever 9 of the pushbutton switch 8 is fitted on the groove 69 in the tuning shaft. Then, with the positioning projection 66 on the switch 8 fitted in the concavity 61 in the front panel 2, the screw 60' is inserted into the fixing hole 60 and tightened into the screw hole 65 in the switch 8, thus securing the switch to the front panel.

Next, in the variation shown in FIG. 14, the front plate of the switch is fixed to the front face of the front panel. That is, there is provided an internally-threaded screw hole 60A at the obliquely upper position in the front panel of the apparatus. On the other hand, a fixing hole 65A is formed in the front plate 64 of the pushbutton switch 8 at the upper position.

In order to mount the pushbutton switch 8 to the front panel 2 according to this variation, first the engagement piece 67 of the pushbutton switch 8 is inserted into the cut 63 provided in the tongue piece 62 in the front panel 2. Next, the cut 68 formed in the front end of the operating lever 9 of the pushbutton switch 8 is fitted in the groove 69 in the tuning shaft 4. After that, with the positioning projection 66 provided on the switch 8 set in the concavity 61 formed in the front panel 2, the screw 60' is inserted into the fixing hole 65 and tightened into the screw hole 60A in the front panel 2, thereby securing the front panel 2 and switch 8 to each other.

According to the variation of the present invention having been described in the above, since it is possible to fix the pushbutton switch to the front panel with a single screw, the number of steps for installation is reduced and the number of parts is also minimized because the number of screws is small as compared with the conventional apparatus. Further, since a tapped hole has to be made at only one place in the switch during the process of manufacture, the manufacturing procedure is advantageously simplified.

Furthermore, the positioning concavity and projection provided on the front panel and the switch front plate respectively, as in the illustrated variations, permit them to be accurately secured to each other. In case the cut 63 is a slit as shown in FIG. 13, it prevents the engagement piece 67 from moving laterally, thus assuring a more accurate fixation of the front panel and switch to each other.

Figure 15:
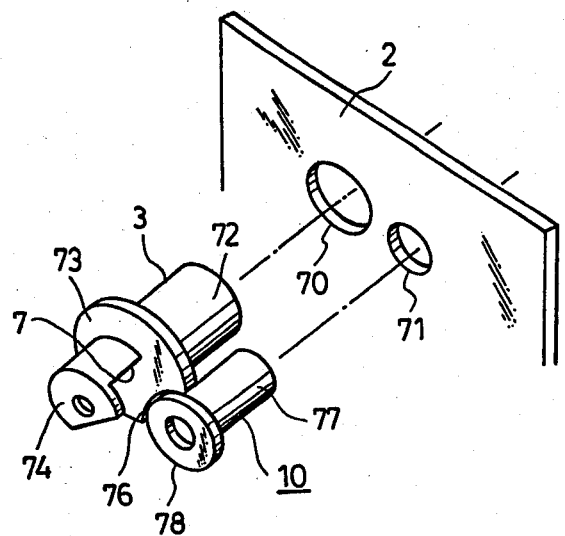
FIG. 15 is an exploded perspective view showing a variation in a bearing mounting mechanism of the pushbutton-operated waveband or station selector according to FIG. 1.

FIG. 15 shows a variation of the bearing mount mechanism for use in the pushbutton-operated waveband or station selection according to the present invention, in which a positioning cut is formed in the outer circumference of one of bearings disposed adjoining to each other, the outer circumference of the other bearing being fitted in said cut, thereby causing the one of the bearings which has the cut to always be positioned with respect to the other bearing in a predetermined manner.

Referring to FIG. 15, the reference numeral 70 denotes a bearing mount hole formed in the front panel for receiving the base portion of the tuning shaft. The numeral 71 refers to an idler gear bearing mount hole formed in the front panel 2. The numeral 3 denotes the bearing for the tuning shaft base portion. This bearing 3 consists of a fitting portion 72 which is to be fitted into the mount hole in the front panel, flange 73 disposed on the rear side of the fitting portion 72, and a bearing support 74 on the rear side of the flange 73. The bearing support 74 is partially cut (at the numeral 7) on the side facing the idler gear. Further, there is formed in the flange 73 a positioning circular cut 76 facing in the same direction as the cut 7. The numeral 10 indicates the bearing for the idler gear; also this bearing is composed of a fitting portion 77 which is to be fitted into the mount hole 71 in the front panel 2, and a flange 78 arranged on the rear side of the fitting portion 77. The outside diameter of the flange 78 is equal to that of the circular cut 76 formed in the flange 73.

In order to mount the above-described bearing mount mechanism to the front panel 2, first the idler gear bearing 10 is fitted into the mount hole 71 formed in the front panel 2 and fixed to the front panel by caulking. Next, the tuning shaft base portion bearing 3 is fitted into the mount hole 70 formed in the front panel 2; in this case, the positioning cut 76 formed in the flange 73 is fitted on the outer circumference of the flange 78 of the adjoining cut 10. Thus, the bearing 3 is easily positioned so that the cut 7 for the idler gear is always directed to the adjoining idler gear. After the bearing 3 is completely positioned, it is fixed to the front panel 2 by calking.

As having been described in the foregoing, according to the bearing mount mechanism according to the present invention, it is possible to easily and correctly position the bearing simply by applying the cut formed in the outer circumference of the bearing to the outer circumference of the adjoining bearing.

It should be noted that the present invention is not limited to the bearing mount mechanisms illustrated and described by way of example in the foregoing; for example, where the outer circumference of the adjoining bearing is not circular, of course the cut formed in the flange will not be circular but corresponds to the outer circumference of the adjoining bearing. In the illustrated examples, the adjoining flange has formed thereon a flange; however, this flange is not always necessary. The cut may be directly applied to the outer circumference of the bearing. Also, the positioning cut may not always be formed in the flange. In case of a simple cylindrical bearing without any flange, the bearing may be partially cut to form a cut.

Finally, the bearing mount mechanism according to the present invention can not only be used for the bearings for the tuning shaft and idler gear of the pushbutton-operated waveband or station selector, but also for a plurality of bearings similarly disposed adjoining to each other (2 or more bearings, 3 bearings or 4 bearings).

Figure 17:
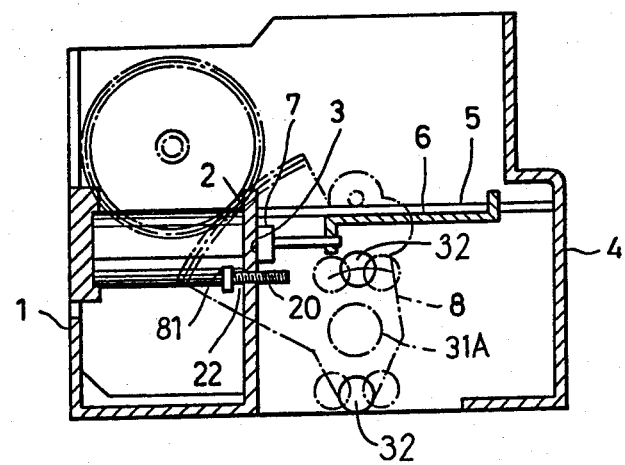
FIG. 17 is a sectional side view showing the core stroke adjusting mechanism in FIG. 16.

FIGS. 16 and 17 illustrate variations of the core stroke adjusting mechanism in the pushbutton-operated waveband or station selector according to the present invention, in which a screw hole is formed in the core mount plate provided on the rear side of the frame and the end of a screw set in the hole can engage a crank rod or side plate of the pivoting crank so that the screw is usable as stopper for adjustment of the core stroke in a pushbutton-operated waveband or station selector with no upper plate, and also permits easy fine adjustment of the core stroke.

Referring to these FIGS. 16 and 17, the numeral 37 refers to a rear panel of the apparatus frame. This panel serves as the coil mount plate. The coil mount plate 37 has formed therein a screw hole 80 which is internally threaded. In this screw hole 80, there is set a screw 81 as stopper with the front end thereof being directed toward the front face of the coil mount plate 37. Further, there is provided between the head of the screw 81 projecting to the rear side of the coil mount plate 37 and the latter a coil spring 82 as compressed for prevention of the screw 81 from being loosened.

The screw hole 80 is formed in the coil mount plate 37 in a position where the front end of the screw 81 can engage the crank rod 32 or side plate 31' of the pivoting crank That is, since the side plate 31' of the pivoting crank is engaged with the core slide plate 34, the pivot angle of this crank has only to be adjusted for the purpose of adjusting the core stroke. In this example, the screw 81 can engage the end thereof on the rod 32 or side plate 31' of the pivoting crank to adjust the pivoting range of the crank and consequently adjust the stroke of the core. Therefore, in order to adjust the core stroke in the apparatus according to the present invention, the screw 81 is turned so as to change the projected extent of the end of the screw 81 to adjust the pivot angle of the pivoting crank.

As having been described with reference to the variations in the foregoing, the core stroke adjusting mechanism according to the present invention permits very fine adjustment of the projection of the screw from the surface of the coil mount plate by changing the turn of the screw. Therefore, it is possible to finely adjust the pivot angle of the pivoting crank which abuts on the screw, that is to say, the stroke of the core which is moved to-and-fro by the pivoting crank. Further, since the screw may abut on any portion of the side plate or crank rod of the pivoting crank, it may be located in any position on the coil mount plate within the pivoting range of the crank. Thus, since the screw may be disposed in a marginal space such as the coil mounting space without providing any exclusive space for installation of a stroke adjusting stopper on the coil mount plate, the coil mount plate can be effectively designed small. In addition, the core stroke adjusting mechanism is applicable for a pushbutton-operated waveband or station selector provided with no upper plate since the screw is provided on the coil mount plate.

As having been described with reference to the variations as illustrated in the foregoing, in case a spring 82 is provided as compressed between the head of the screw and the coil mount plate, the screw can be completely prevented from being loosened; thus a core stroke once set is correctly followed, and no deviation of frequency will occur.

The embodiments of the invention in which an exclusive property or privilege is claimed are defined as follows:

1. A pushbutton operated selector apparatus, comprising a front panel, side plates disposed at opposite ends of said front panel, a bracket mechanism which includes a pushbutton supported on an outer side of said front panel for reciprocal movement between two positions, a mechanism which includes a rotatably supported tuning shaft, a coil, a core shifting mechanism supporting a core for movement within said coil, clutch means cooperable with said core shifting mechanism for selectively effecting movement of said core within said coil in response to one of movement of said pushbutton and rotation of said tuning shaft; a power switch for selectively applying electrical power to a circuit of said apparatus; and an operating lever which is adapted to turn on and turn off said power switch, said tuning shaft being movable axially and operatively engaging said operating lever, movement of said tuning shaft in respective axial directions causing said operating lever to turn said power switch on and off.

2. An apparatus as set forth in claim 2, wherein said bracket mechanism includes a movably supported kick arm which can be moved by said bracket mechanism when said pushbutton is moved, and wherein said clutch means includes a clutch lever and a roller supported rotatably on a front end of said clutch lever, said clutch means normally operatively coupling said tuning shaft to said core shifting mechanism, said kick arm having thereon a push piece which projects toward said roller, said push piece having an end which engages and moves said roller when said kick arm is moved by said bracket mechanism in response to movement of said pushbutton, movement of said roller causing said clutch lever to move and said clutch means being responsive to said movement of said clutch lever for disengaging said operative coupling of said tuning shaft and said core shifting mechanism.

3. An apparatus as set forth in claim 4, wherein said push piece extends obliquely with respect to said kick arm.

4. An apparatus as set forth in claim 4, wherein said roller is oriented at an angle with respect to said clutch lever in a manner so that said push piece on said kick arm moves in a direction substantially tangential to said roller.

5. An apparatus as set forth in claim 1, including a pinion gear shaft operatively connecting said tuning shaft and said clutch means, and including bearing plates which rotatably support said pinion gear shaft, at least one said bearing plate being substantially perpendicular to said pinion gear shaft.

6. An apparatus as set forth in claim 2, wherein said front panel has provided thereon a tongue piece projecting perpendicular thereto, said tongue piece having formed thereon an opening in which an engagement piece provided on said switch is received.

7. An apparatus as set forth in claim 1, including a pinion gear shaft operatively coupled to said clutch means, bearing plates which rotatably support said pinion gear shaft, an idler gear which meshes with a gear provided on said tuning shaft and is operatively coupled to said pinion gear shaft, and two bearings supported on said front panel and respectively adapted to rotatably support said tuning shaft and said idler gear, there being formed in an outer circumference of one of said bearings a positioning recess which receives an outer circumference of the other bearing.

8. An apparatus as set forth in claim 1, including a pivoting crank operatively coupled to said bracket mechanism, said core shifting mechanism including a core slide plate which supports said core, a guide shaft to guide said core slide plate during movement thereof, and a coil mount which supports said coils, said pivoting crank being pivoted by said bracket mechanism when said pushbutton is pushed and being arranged to move said core slide plate along said guide shaft in response to rotation of said pivoting crank, said coil mount plate having supported therein a screw which limits pivoting of said crank.

9. A pushbutton operated selector apparatus, comprising a front panel, side plates disposed at opposite ends of said front panel, a bracket mechanism which includes a pushbutton supported on an outer side of said front panel for reciprocal movement between two positions, a mechanism which includes a rotatably supported tuning shaft, a coil, a core shifting mechanism supporting a core for movement within said coil, and clutch means cooperable with said core shifting mechanism for selectively effecting movement of said core within said coil in response to one of movement of said pushbutton and rotation of said tuning shaft; wherein said core shifting mechanism further includes a movably supported core slide plate which supports said core, a guide shaft to guide said core slide plate during movement thereof, and a coil mount plate which supports said coil, said guide shaft being supported between said coil mount plate and said front panel as to be rotatable and fixed against axial movement.

10. An apparatus as set forth in claim 1 or claim 9, wherein said clutch means and said mechanism which includes said tuning shaft are each disposed between said side plates and above said bracket mechanism.

* * * * *

UNITED STATES PATENT AND TRADEMARK OFFICE
CERTIFICATE OF CORRECTION

PATENT NO. : 4 468 976

DATED : September 4, 1984

INVENTOR(S) : Takao Chaki et al

It is certified that error appears in the above-identified patent and that said Letters Patent is hereby corrected as shown below:

Column 13, line 54; change "claim 2," to ---claim 1,---.

Column 14, line 3; change "claim 4," to ---claim 2,---.

line 6; change "claim 4," to ---claim 2,---.

line 17; change "claim 2," to ---claim 1,---.

line 20; change "thereon" to ---therein---.

line 38; after "mount" insert ---plate---.

Signed and Sealed this

Fifth Day of March 1985

[SEAL]

*Attest:*

DONALD J. QUIGG

*Attesting Officer*  *Acting Commissioner of Patents and Trademarks*